United States Patent [19]

Floymayr et al.

[11] 4,218,424

[45] Aug. 19, 1980

[54] APPARATUS FOR THE ZONE PULLING OF MONOCRYSTAL RODS

[75] Inventors: Joachim Floymayr; Karl Jericho, both of Hanau am Main; Dietrich Drechsel, Bruchköbel; Friedrich Bubeck, Pforzheim, all of Fed. Rep. of Germany

[73] Assignee: Leybold-Heraeus GmbH & Co. KG, Cologne, Fed. Rep. of Germany

[21] Appl. No.: 830,379

[22] Filed: Sep. 2, 1977

[30] Foreign Application Priority Data

Sep. 8, 1976 [DE] Fed. Rep. of Germany ....... 2640377

[51] Int. Cl.² .............................................. B01J 17/11
[52] U.S. Cl. .............................. 422/249; 156/DIG. 98
[58] Field of Search ......... 156/617 SP, 620, DIG. 98; 23/273 SP, 273 Z; 422/249

[56] References Cited

U.S. PATENT DOCUMENTS

| 3,030,194 | 4/1962 | Emeis | 156/620 |
| 3,160,478 | 12/1964 | Rummel | 23/273 Z |
| 3,291,570 | 12/1966 | Michl | 23/273 Z |

FOREIGN PATENT DOCUMENTS 1519871 of 0000 Fed. Rep. of Germany.
1226473 3/1971 United Kingdom ...................... 156/620

OTHER PUBLICATIONS

Brandes, J. of Scientific Instru., Oct., 1966, pp. 716 to 717.
Lawson, Preparation of Single Crystals, 1958, p. 67.
Bachmann, J of Cryst. Growth, vol. 18, #1; Jan. 1973, pp. 13 to 19.

*Primary Examiner*—Hiram H. Bernstein
*Attorney, Agent, or Firm*—Sprung, Felfe, Horn, Lynch & Kramer

[57] ABSTRACT

An apparatus for the zone drawing of monocrystal rods comprises a hermetically sealed housing having two rod holders movably disposed rotatably and vertically one over the other within the housing. A stationary high frequency heating system is disposed between the rod holders. Each rod holder comprises one transport slide, a sliding guide and a spindle drive disposed within the housing for the independent vertical movement of the rod holders and one drive for the rotation of the rod holders.

6 Claims, 6 Drawing Figures

APPARATUS FOR THE ZONE PULLING OF MONOCRYSTAL RODS

BACKGROUND OF THE INVENTION

The invention relates to an apparatus for the zone pulling of monocrystal rods, which consists of a hermetically sealed housing having rod holders disposed one over the other within the said housing for rotation and vertical movement, and a fixed high-frequency heating system disposed between them, and having a transport slide with sliding guide means and spindle drive for the independent vertical movement of each rod holder, and having a drive for the rotation of each rod holder.

An apparatus of the above-described kind is disclosed in German Auslegeschrift No. 15 19 871. In it the slide guides and the spindle drives for the rod holders are disposed outside of the housing, and the shafts at whose extremities the rod holders extend through the wall of the housing. The heating system in the form of a high-frequency coil is disposed fixedly approximately in the center of the housing.

In this type of design, the housing fundamentally must first have a slightly greater height than twice the maximum length of the rod which is to be remelted without the use of a crucible, or the length of of the monocrystal which is to be produced, as the case may be, since virtually the entire length of the rod has to pass through the heating system. To the height of the housing must be added the lengths of the two rod holder drive shafts, since they have to perform a travel of that length outside of the housing. Also to be added to the total overall height are the intervals necessitated by the indispensable mountings and guides and the housing as well as the drive motors. Of course, the length of the spindle drives outside of the housing must correspond also to the vertical movements of the above-described drive parts and rod holders. The structural height of such known apparatus therefore generally amounts to not less than about 5 to 6 times the useful crystal length, which is less than the length of the raw monocrystal, since the transitional taper and other portions have to be discarded. In one practical embodiment, the total height of the apparatus is 8.0 m, whereas a useful crystal length of no more than 1.4 m can be achieved. Such a structural height, however, is intolerable for most applications, since only rarely is production space available with this amount of overhead clearance.

It is also known to reduce the structural height of zone pulling installations by a different principle of design. In this case the rod which is to be remelted is held at substantially the same height within the housing, while only one of the two rod holders has to perform a slight vertical movement corresponding to the draw-press ratio to be maintained in the production of the crystal. For the performance of the necessary relative movement between the rod and the heating apparatus, however, the high-frequency coil must be moved vertically in this case. This, however, leads to special problems with regard to the supply of power to the high-frequency coil. A cable connection to the high-frequency generator is not only disadvantageous for safety of operation, but it also results in considerable power losses due to the length of the cable. Any kind of rigid connecting of the high-frequency coil to the oscillating circuit makes it necessary to locate the latter within the housing. Thus an undesirably large pot diameter has to be accepted, while the problem of the moving power supply is still unsolved. In addition, an oscillator circuit for an output power of 50 kW weighs on the order of about 250 kg, so that, in the case of vertical movement of the oscillator circuit, an appropriately stable guidance system has to be provided along with a sufficiently powerful drive. At the same time, it is exceedingly difficult to assure the necessary freedom from vibration. Consequently, this kind of design principle of kind utilized heretofore only in the case of relatively small monocrystals.

SUMMARY OF THE INVENTION

The invention is addressed to the problem of greatly reducing the structural height of an apparatus of the kind described above and of appreciably simplifying the drive system.

An especially advantageous embodiment is addressed to the problem of finding a simple manner for making the excentricity of the two rod portions variable.

The attainment of the object of the invention is accomplished in accordance with the invention in the initially described apparatus, by disposing the sliding guide means and spindle drives within the housing.

By this measure the structural height of the housing itself is increased but slightly. The above-mentioned drive elements are placed inside of the housing so that the corresponding structural lengths provided for the sliding guide means and the spindle drives will not add to one another. In establishing the length of the rod holder drive shafts, no consideration need be given to their longitudinal displacement, so that they can be made extraordinarily short, compact and rigid, which has a beneficial effect on the tendency of the whole structure to vibrate. Longitudinal displacement of drive parts outside of the housing does not take place, so that here, again, no space has to be provided for the vertical movement of drive parts. It has been found that, through the teaching of the invention, a structural height of 5.0 m and less can be maintained, while permitting a useful crystal length of 1.4 m. Vertically movable connections between the generator and the high-frequency coil are entirely eliminated.

One particularly advantageous embodiment of the invention is characterized in that the sliding guide means consists of two guide columns forming a frame, and that the frame is suspended within the housing. A frame design of this kind can not only be compactly constructed, but it also has a high mechanical strength which is further enhanced by its suspension within the housing. The housing itself has a high inherent rigidity which does not require improvement by external frames, bracing or the like.

A system which is mechanically very reliable and particularly simple with regard to drive power and reaction power is characterized in accordance with the further invention by the fact that the drive spindles are located substantially in the same plane as the guide columns, and their drive ends extend through the wall of the housing to the spindle motors, and that the rod holders are fastened to a bracket provided on the transport slide and projecting from the plane of the guide columns and the drive spindles.

A design of this kind requires only one passage through the housing for each rod holder and for the drive spindles required therefor, and this additionally makes it possible for the excentricity or lateral offset of the axes of rotation of the two rod portions to be adjustable. This is accomplished in a very simple manner by arranging for at least one of the frames to be suspended for rotation about the axis of rotation of the corresponding drive spindle. In the case of a swinging movement about this axis, the projecting bracket performs a swinging movement which is followed by the axis of rotation of the rod portion, so that in this manner the lateral offset of the axis of rotation of the one rod portion can be varied with respect to the other.

The apparatus of the invention, however, also makes it possible—in contrast to the state of the art—to dispose the rod rotating motors within the housing. Controlled-speed multipole motors aligned coaxially with the axis of rotation of the rod and connected directly to the rod holders can serve to special advantage for this purpose. Such multipole motors have become known for other applications. Their rotary speed can be varied within a very wide range between, for example, 0.1 and 2,000 revolutions per minute. Nevertheless, they are of inherently very compact construction.

With respect to the conditions of operation prevailing within the housing (vacuum or inert gas) and the required freedom of the drive from vibration, it is also especially advantageous to encapsulate the drive motors hermetically with respect to the housing and to equip them with a gas bearing or hydrodynamic bearing. The design is especially simplified if the drive motors are constructed in the form of external rotor motors, and it is desirable for the means for holding the end of the rod to be fastened coaxially to the external rotor.

BRIEF DESCRIPTION OF THE DRAWINGS

An example of the embodiment of the invention and the manner of the operation thereof will now be described with the aid of the appended drawings, FIGS. 1 to 6.

FIG. 5 is a top plan view of the apparatus of FIG. 1 taken in the direction of the arrow V with the housing removed.

DETAILED DESCRIPTION OF THE INVENTION

Figure 1:
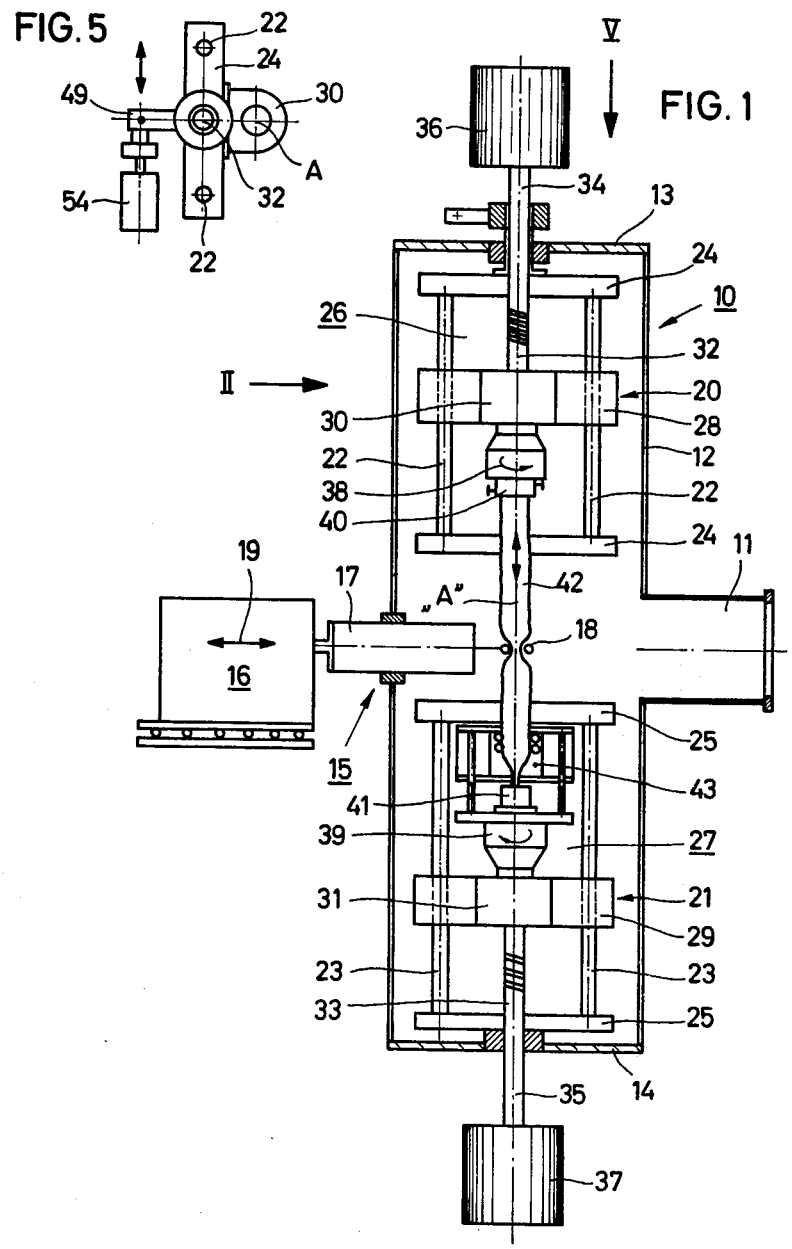
FIG. 1 is a diagrammatic side elevational view of a complete apparatus with the front wall of the housing removed.

In FIG. 1, 10 designates a hermetically sealed housing in which a vacuum or an inert gas atmosphere or an atmosphere for the doping of semiconductor material can be produced. The housing 10 is provided with a connection for a vacuum pump, which is not shown. The housing 10 consists essentially of a cylindrical pot 12 closed at top and bottom by end walls 13 and 14.

With the housing 10 there is associated a high-frequency heating system generally designated as 15, which consists of the high-frequency oscillating circuit 16 of a high-frequency generator which is known, a coaxial housing lead-through 17 and a high-frequency coil 18. The entire system 16, 17 and 18 is displaceable in the direction of the arrow 19 to permit the axis of the high-frequency coil 18 to be adjusted with respect to the axis of the housing 10.

An upper sliding guide means 20 and a lower sliding guide means 21 are located within the housing 10. These two sliding guide means consist each of a pair 22 and 23 of vertical guide columns joined together by crosspieces 24 and 25, respectively, together forming frames 26 and 27, respectively. On each pair 22 and 23 of the guide columns there is mounted for longitudinal displacement thereon a transport slide 28 and 29, respectively, having in its center a projecting bracket 30 and 31, respectively.

A drive spindle 32 and 33 is mounted in each of the crosspieces 24 and 25, respectively, such that its axis of rotation is in the same plane as the axis of the guiding column 22 and 23, respectively. The drive spindles 32 and 33 are carried through the transport slides 28 and 29 and cooperate with nuts provided thereon, which are not further identified. The spindle drive formed in this manner is constructed in the manner of a rolling ball spindle. By appropriate rotation of the drive spindles 32 and 33 it is possible to raise and lower the transport slides 28 and 29, respectively, on their corresponding guide columns, doing so either in the same direction and at the same speed or independently of one another. The latter possibility serves advantageously for the regulated variation of the stretch-press ratio.

The ends 34 and 35 of the drive spindles extend through the end walls 13 and 14 of the housing 10 and are connected to the spindle motors 36 and 37, respectively, for example by a belt drive.

On the brackets 30 and 31 of transport slides 28 and 29 there are provided drive motors 38 and 39 which are provided with rotatable rod holders 40 and 41, respectively. The arrangement in this case is such that the drive motor 38 with the rod holder 40 of the upper drive is facing downward and the drive motor 39 with the rod holder 41 is facing upward.

Between the two rod holders 40 and 41 is the rod 42, which is to be remelted to form a monocrystal, and which has the wasp-waisted constriction typical of this process in the vicinity of the high-frequency coil 18. By means of the lower rod holder 41 the seed crystal is held. The lower part of the rod 42 is for this purpose surrounded by a gripping means 43, which has been described in U.S. Pat. Application Ser. No. 676,187, filed Apr. 12, 1976.

In the appended drawings, identical parts are provided with identical reference numbers to avoid repetition.

Figure 2:
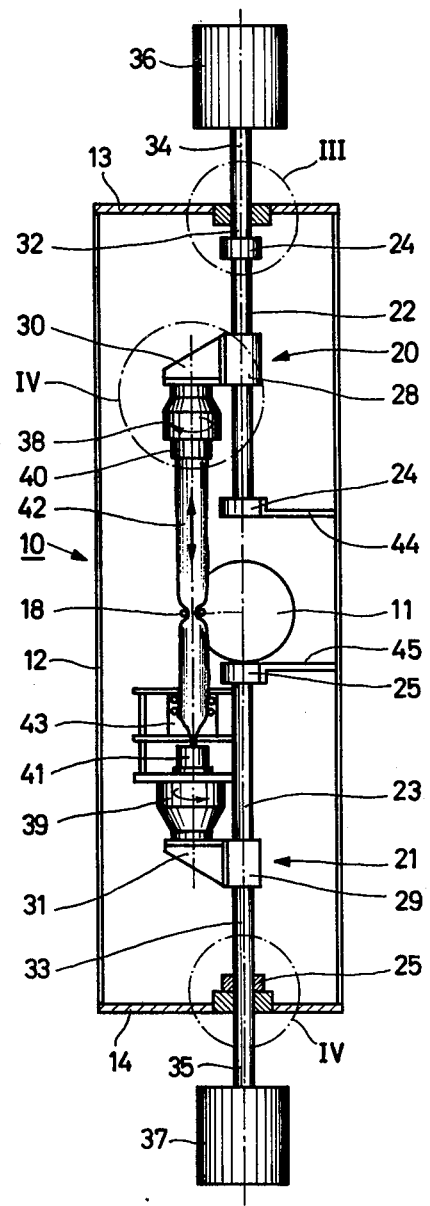
FIG. 2 is a view of the apparatus of FIG. 1 taken at a right angle thereto in the direction of the arrow II.

It can be seen clearly from FIG. 2 in conjunction with FIG. 1 that the brackets 30 and 31 project out of the plane of the frames which are formed by the guide columns 22 and 23, respectively, and the crosspieces 24 and 25, respectively, so that the rotation axes of the drive motors 38 and 39 and of the rod holders 40 and 41 are disposed at a marked lateral offset from the axis of rotation of the drive spindles 32 and 33. In this manner the drive means partially overlap one another, so that their length does not add. Furthermore, by this measure a variation of the lateral offset of the rotation axes of the two parts of the rod 42 becomes possible, and this will be discussed in detail in connection with FIG. 5. The crosspieces 24 and 25 located at the inner ends of the drive spindles 32 and 33, respectively, are connected by horizontal supports 44 and 45 to the pot jacket 12 in order thus to assure a high inherent rigidity of the drive system. The crosspiece 24 is additionally rotatable with respect to the corresponding horizontal support 44, namely about the common axis of the drive spindle 32, and this will also be discussed in greater detail in connection with FIG. 5.

Figure 3:
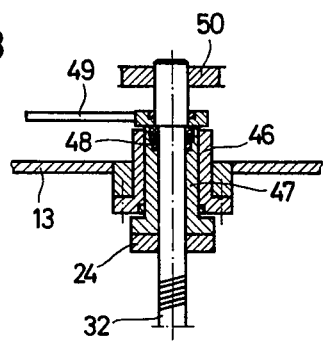
FIG. 3 is an enlarged detail of the apparatus of FIG. 2 within the circle III thereof.

FIG. 3 shows the upper pass-through of the drive spindle 32 through the end wall 13 of the housing 10. For this purpose a sleeve 46 is inserted into the end wall 13 and an additional sleeve 47 is disposed rotatably therein. Between the sleeve 47 and the drive spindle 32 there is a system of packings 48. A lever 49 is affixed to the upper end of the sleeve 47 and the crosspiece 24 is affixed to the lower end of the sleeve 47. By a lateral movement of the lever 49 it is thus possible to move the crosspiece 24 by the same amount. This will be further discussed in conjunction with FIG. 5. At the upper end of the drive spindle 32 there is a belt pulley 50 which is connected by a belt, which is not shown, to the spindle motor 36 (FIG. 1).

Figure 4:
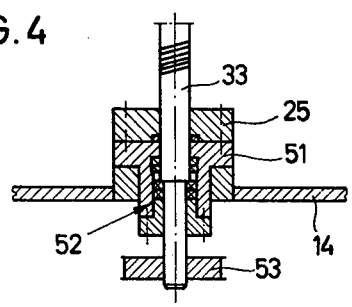
FIG. 4 is an enlarged detail of the apparatus of FIG. 2 within the circle IV thereof.

FIG. 4 shows a similar pass-through of the drive spindle 33 through the lower end wall 14 of the pot jacket 12. In this case, however, no mechanism is provided for the rotation of the corresponding crosspiece of frame 27; instead, the crosspiece 25 is directly bolted to a sleeve 51 which is inserted fixedly into the end wall 14. A packing 52 again provides for the required hermetic seal. The drive spindle 33 is connected through a belt pulley 53 to the spindle 37 by means of a V-belt.

FIG. 5 shows the apparatus for varying the lateral offset between the axes of rotation of the two parts of the rod 42. The crosspieces 24 and the guide columns 22 which form the frame 26 in FIG. 1 are rotatable about the axis of rotation of the drive spindle 32 by means of the lever 49, the same as in FIG. 3. For the practice of the turning movement a corresponding drive 54 is provided. In this case the laterally extending bracket 30 performs a swinging movement which is followed by the rod axis "A". Since the longitudinal axis of the lower part of the rod 42 is not displaced laterally, a corresponding lateral offset results from the difference.

Figure 6:
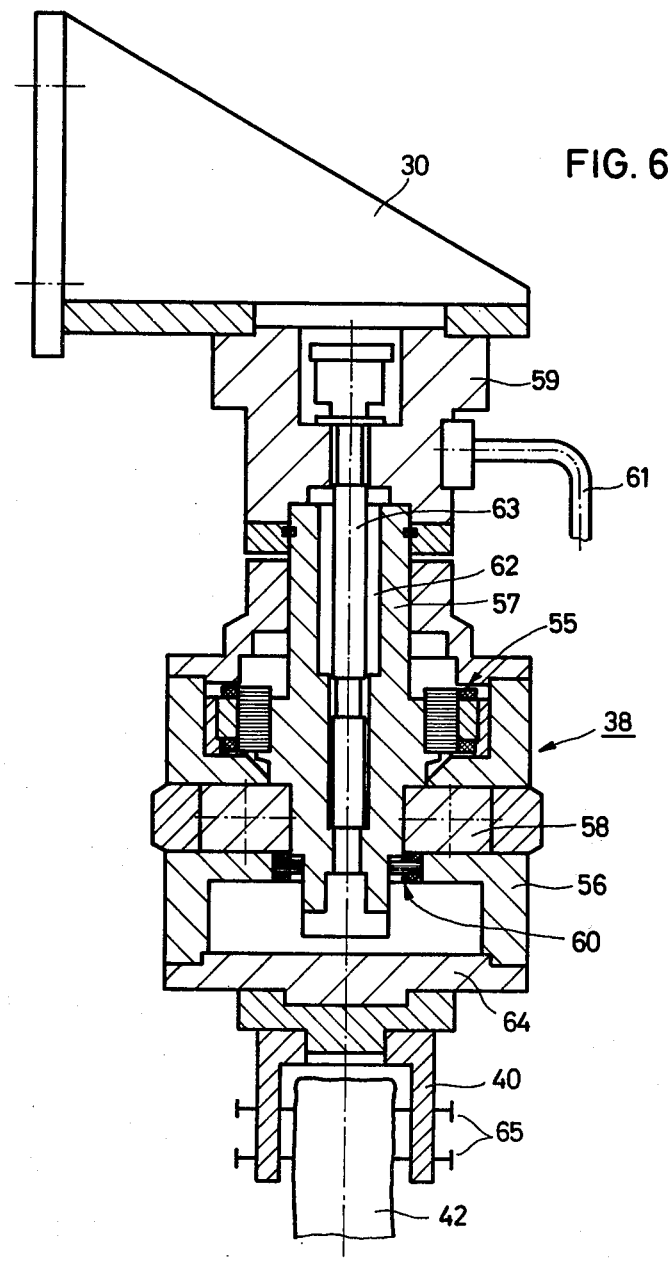
FIG. 6 is an enlarged detail of FIG. 2 within the circle VI thereof, in a mirror-image reversal.

The following can best be seen in FIG. 6. The drive motor 38 for the rod rotation is fastened by a vertical motor shaft to the bracket 30 which in turn is part of the transport slide 28, which is not shown here. The drive motor 38 is a four-pole external rotor motor whose windings are designated by the numeral 55. The motor has a hermetically sealed housing 56 which is rotatably mounted in a gas bearing 58 on a stationary hollow shaft 57. The hollow shaft 57 is affixed to a mounting flange 59 which in turn is bolted to the bracket 30. Between the hollow shaft 57 and the housing 56 there is also a tachometer transmitter 60 which serves for the indication of the rotatory speed and for the regulation of the speed of the motor 38. The compressed gas for the gas bearing is fed through a line 61 whence it flows through the annular gap 62 to the gas bearing 58 and back through a central tube 63 through the hollow shaft. The return line for the compressed gas has been omitted for the sake of simplicity. The hollow shaft 57 also serves to accommodate the conductors (not shown) for the winding 55 and for the tachometer transmitter 60.

The housing 56 is hermetically closed at its bottom end by a plate 64 to which the rod holder 40 is fastened coaxially. The rod holder 40 has a plurality of set screws 65 for gripping the rod 42. The drive motor 39 for the lower rod holder is of entirely identical construction, but it is installed in the reverse position. FIG. 6 shows the extremely compact construction of the drive combined with minimal structural length, which permits a vibration-free and trouble-free drive in the atmosphere prevailing in the interior of the housing 10.

What is claimed is:

1. An apparatus for the zone drawing of a monocrystal rod, comprising: a hermetically sealed housing, two vertically aligned rod holders disposed one above the other in the housing; sliding guide means disposed within the housing for effecting the independent vertical movement of each rod holder and comprising two vertically movable transport slides, two rotatable spindle drives having their drive ends extending through opposite end walls of the housing and having the other ends cooperative with their associated transport slides to effect vertical movement of the transport slides along the sliding guide means when the spindle drives are rotated and at least two guiding columns for each transport slide defining a frame for guiding the corresponding transport slide wherein the frames are disposed in an axially parallel manner in the housing; means mounting at least one of the frames for rotation about the axis of rotation of the corresponding drive spindles; drive motors disposed within the housing and mounted on each transport slide for rotating the corresponding rod holder and thereby a rod held therebetween; and a vertically stationary high frequency heating system having the coil thereof disposed at a point within the housing and between the two rod holders.

2. The apparatus according to claim 1, wherein the spindle drives lie in substantially the same plane as the guiding columns, and further comprising spindle motors operatively connected to the drive ends and a bracket fastened to the rod holders and on the transport slides extending out of the plane of the guiding columns and drive spindles.

3. The apparatus according to claim 1, wherein the spindle drives comprise ball spindle drives and the sliding guide means further comprise one of ball or roller guide means.

4. The apparatus according to claim 1, wherein the drive motors for the rod rotation comprise speed regulatable multipole motors, coaxially aligned to the axis of rotation of the rod and connected directly to the rod holders.

5. The apparatus according to claim 4, wherein drive motors are encapsulated hermetically in relation to the housing and have a gas bearing.

6. The apparatus according to claim 6, wherein the drive motors comprise external rotor type motors.

* * * * *